(12) United States Patent
Yun et al.

(10) Patent No.: US 7,205,232 B2
(45) Date of Patent: Apr. 17, 2007

(54) METHOD OF FORMING A SELF-ALIGNED CONTACT STRUCTURE USING A SACRIFICIAL MASK LAYER

(75) Inventors: Cheol-Ju Yun, Gyeonggi-do (KR); Tae-Young Chung, Gyeonggi-do (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 518 days.

(21) Appl. No.: 10/846,810

(22) Filed: May 13, 2004

(65) Prior Publication Data

US 2004/0241974 A1    Dec. 2, 2004

(30) Foreign Application Priority Data

May 27, 2003    (KR) .................... 10-2003-0033863

(51) Int. Cl.
*H01L 21/44*    (2006.01)
*H01L 23/52*    (2006.01)

(52) U.S. Cl. ...................... 438/671; 257/748

(58) Field of Classification Search ................ 257/621, 257/700, 748, 774; 438/597, 652, 669–672
See application file for complete search history.

(56) References Cited

U.S. PATENT DOCUMENTS 6,130,450 A    10/2000    Kohyama et al.
6,534,813 B1   3/2003     Park et al.
6,913,987 B2   7/2005     Haufe et al.

FOREIGN PATENT DOCUMENTS

DE    10256936 B3    9/2004

*Primary Examiner*—Calvin Lee
(74) *Attorney, Agent, or Firm*—Marger Johnson & McCollom, P.C.

(57) ABSTRACT

Disclosed is a method of forming a self-aligned contact structure using a sacrificial mask layer. The method includes forming a plurality of parallel interconnection patterns on a semiconductor substrate. Each of the interconnection patterns has an interconnection and a mask pattern, which are sequentially stacked. Interlayer insulating layer patterns are formed to fill gap regions between the interconnection patterns. The mask patterns are partially etched to form recessed mask patterns that define grooves between the interlayer insulating layer patterns. Then, sacrificial mask patterns filling the grooves are formed. A predetermined region of the interlayer insulating layer patterns is etched using the sacrificial mask patterns as etching masks to form a self-aligned contact hole that exposes a predetermined region of the semiconductor substrate. A spacer is formed of a sidewall of the self-aligned contact hole, and a plug surrounded by the spacer is formed in the self-aligned contact hole.

50 Claims, 18 Drawing Sheets

METHOD OF FORMING A SELF-ALIGNED CONTACT STRUCTURE USING A SACRIFICIAL MASK LAYER

This application claims priority from Korean Patent Application No. 2003-0033863 filed on May 27, 2003, the entire contents of which are hereby incorporated by reference.

BACKGROUND OF THE INVENTION

1. Field of the Invention

This disclosure relates to a method of fabricating a semiconductor device, and more particularly a method of forming a self-aligned contact structure using a sacrificial mask layer.

2. Description of the Related Art

As integrated circuit devices become more highly integrated, the width of interconnections and spacing between interconnections have also been reduced. Self-aligned contact technology has been used to increase alignment margins when using a photolithography technique to form contact holes in predetermined regions between the interconnections.

FIG. 1A to FIG. 1E are cross-sectional diagrams illustrating a method of forming a self-aligned contact structure in accordance with a conventional technique.

Referring to FIG. 1A, a lower insulating layer 20 is formed on a semiconductor substrate 10. Next, a lower conductive layer 30 and a mask layer 40 are sequentially formed on the entire surface of the semiconductor substrate 10 having the lower insulating layer 20 thereon. The mask layer 40 is typically formed of a silicon nitride layer.

Referring to FIG. 1B, the mask layer 40 and the lower conductive layer 30 of FIG. 1A are sequentially patterned to form interconnection patterns 37 having interconnections 35 and mask patterns 45 stacked in sequence. A silicon nitride layer is then formed on the entire surface of the semiconductor substrate having the interconnection patterns 37. An etching back process is performed against the entire surface of the semiconductor substrate having the silicon nitride layer, so that spacers 50 are formed on sidewalls of the interconnection patterns 37.

Referring to FIG. 1C, an interlayer insulating layer 60 is formed on the entire surface of the semiconductor substrate having the interconnection patterns 37 and spacers 50. The interlayer insulating layer 60 completely fills gap regions between the interconnection patterns 37. The interlayer insulating layer 60 is formed of silicon oxide.

Referring to FIG. 1D, a photo-resist pattern 70 having openings, through which the interlayer insulating layer 60 is selectively exposed, is formed on the interlayer insulating layer 60 to form contact holes. The interconnection patterns 37 and the spacers 50 may be partially located under the openings. The interlayer insulating layer 60 is etched using the photo-resist pattern 70 as an etching mask. The interconnection patterns 37 and the spacers 50 located under the openings may serve as etching masks too, so that self-aligned contact holes 75 exposing predetermined regions of the semiconductor substrate 10 are formed.

During the etching process of the interlayer insulating layer 60 a large amount of upper portions of the mask patterns 45 of the interconnection patterns 37 and the spacers 50 is etched away because the mask patterns 45 and the spacers 50 are formed of a silicon nitride layer. Accordingly, upper corners of the interconnections 35 become close to the contact holes 75, or the interconnections 35 may even be exposed through the contact holes 75.

Referring to FIG. 1E, the photo-resist pattern 70 of FIG. 1D is stripped off after the contact holes 75 are formed. An upper conductive layer is formed on the entire surface of the semiconductor substrate 10 to completely fill the contact holes 75. The upper conductive layer is planarized until the upper surface of the interlayer insulating layer 60 is exposed. As a result, a number of contact plugs 85 isolated by the interlayer insulting layer 60 are formed in the contact holes 75.

The conventional technique described above is advantageous in that it is possible to lower an aspect ratio of a contact hole to be formed on the pad plugs by forming such pad plugs 85 in advance, and it has good process margins because self-aligned contact holes are formed.

However, the conventional technique described above has disadvantages as well, as described below.

First, as described referring to FIG. 1D, upper corners of the interconnections 35 may be exposed through the contact holes 75 because the mask patterns 45 and the spacers 50 are partially etched away when the self-aligned contact holes 75 are formed. The exposed interconnections 35 short with the plugs 85, and may cause a device failure. Even if the interconnections 35 are not exposed through the contact holes 75, since the interconnections 35 and the contact holes 75 are too close, a breakdown voltage is low and a device failure may be caused.

Second, in the case of increasing a thickness of the mask layer 40 (FIG. 1A) to prevent the shorts between the interconnections 35 and the plugs 85, a photo lithography process and an etching process to form the mask patterns 45 are difficult and complicated. Further, in such cases, aspect ratios of the contact holes 75 increase, and the fabricated semiconductor device is structurally weak because the increased total height of the device.

Third, in accordance with the conventional technique, as described referring to FIG. 1B, the spacers 50 are formed by forming the silicon nitride layer on the entire surface of the semiconductor substrate 10 having the interconnection patterns 37, and etching back the entire surface of the silicon nitride layer. Accordingly, the spacers 50 cover the sidewalls of the interconnection patterns 37. After filling the remaining space with the interlayer insulating layer 60, dielectric films that include a spacer 50, the interlayer insulating layer 60 and another spacer 50 are interposed between the interconnections 35 as shown in FIG. 1C. In this case, since a silicon nitride layer forming the spacers 50 has a greater dielectric constant than a silicon oxide layer forming the interlayer insulating layer 60, a coupling capacitance between the interconnections 35 is large.

Embodiments of the invention address these and other disadvantages of the prior art.

SUMMARY OF THE INVENTION

Embodiments of the invention provide a method of forming a self-aligned contact structure, the method being capable of lowering a height of a contact plug and preventing etching damages of top surfaces of interconnections as well as preventing shorts or breakdown voltage decreases between the interconnections and the plug.

These embodiments provide a method of forming a self-aligned contact structure, the method being capable of reducing a coupling capacitance between the interconnections.

BRIEF DESCRIPTION OF THE DRAWINGS

The above and other features and advantages of the present invention will become readily apparent to those of ordinary skill in the art by describing in detail preferred embodiments thereof with reference to the attached drawings in which.

DETAILED DESCRIPTION OF THE INVENTION

Figure 1A:
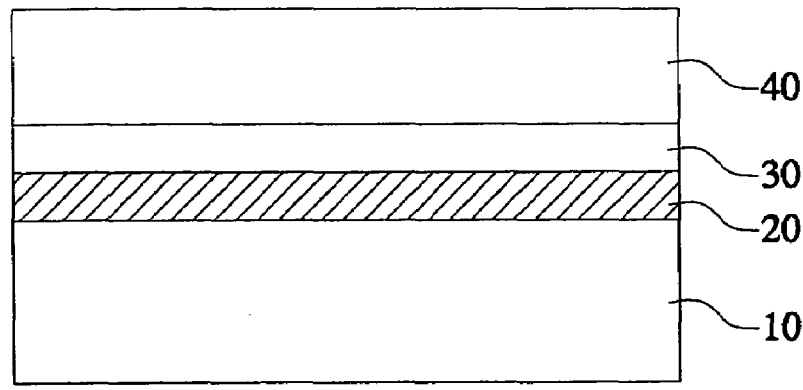
FIGS. 1A to 1E are cross-sectional diagrams illustrating a method of forming a self-aligned contact structure in accordance with a conventional technique.
Figure 1B:
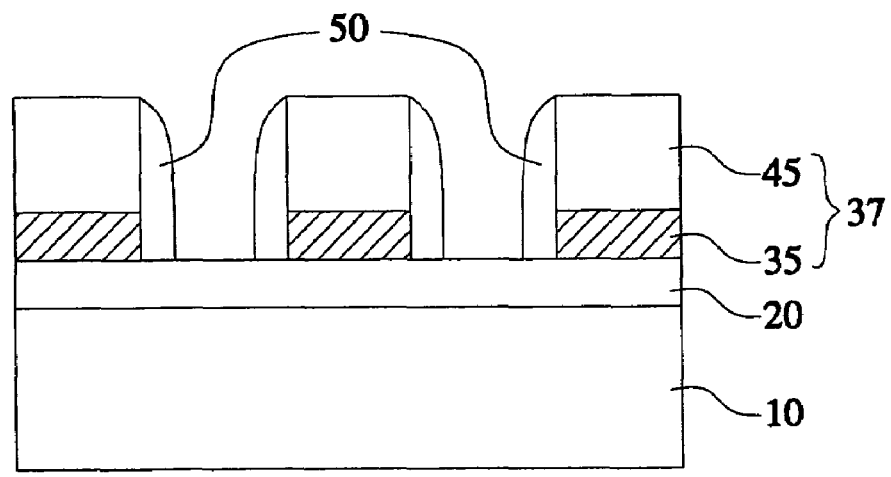
Figure 1C:
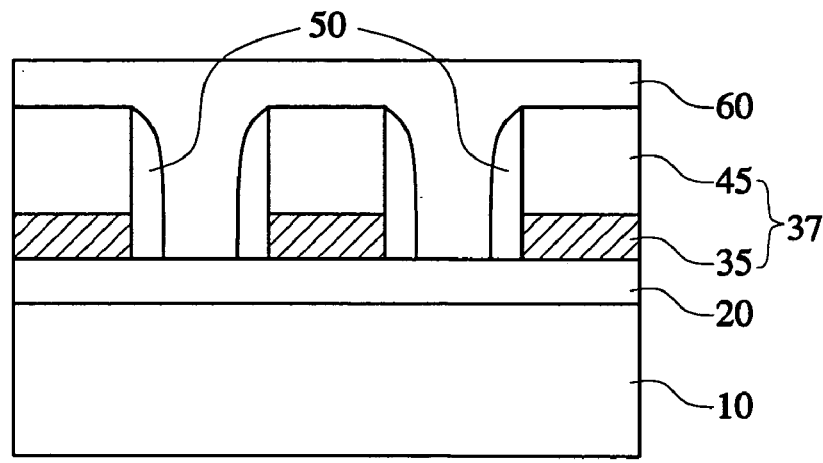
Figure 1D:
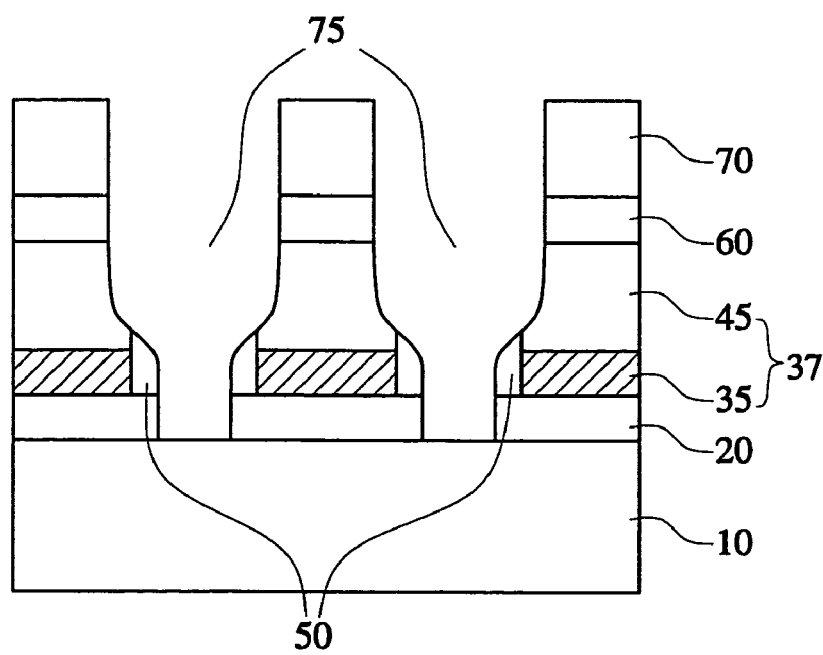
Figure 1E:
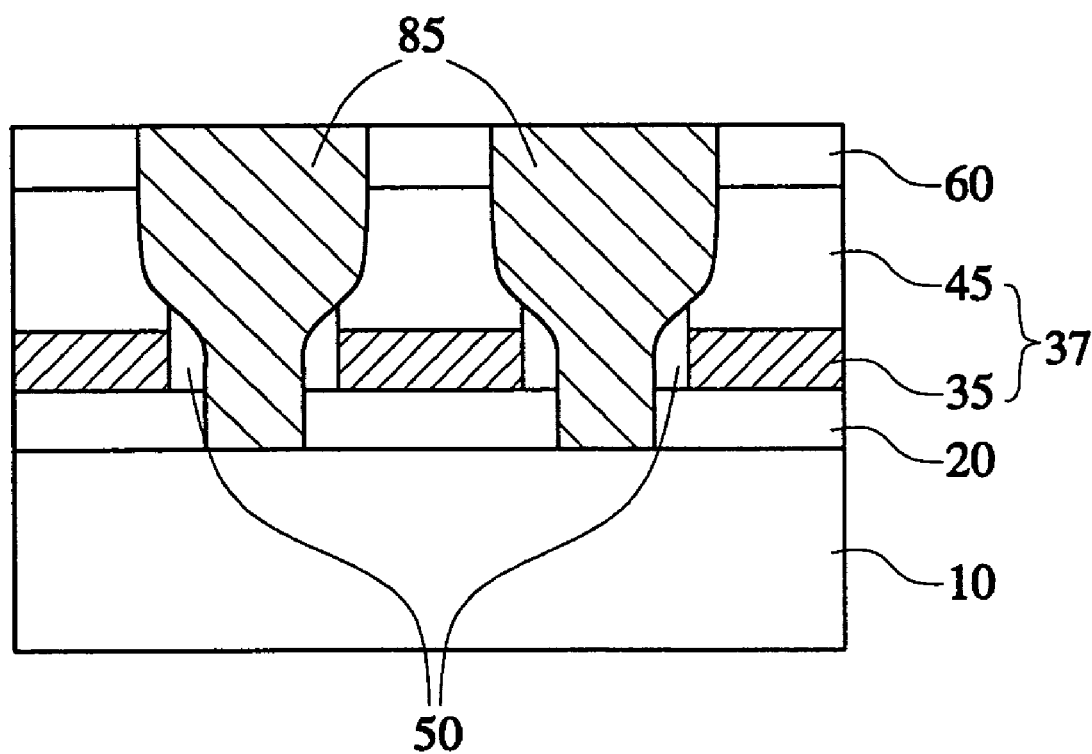

Hereinafter, the present invention will be described in detail by describing preferred embodiments thereof with reference to the accompanying drawings. Like reference numerals refer to like elements throughout the drawings.

Figure 2A:
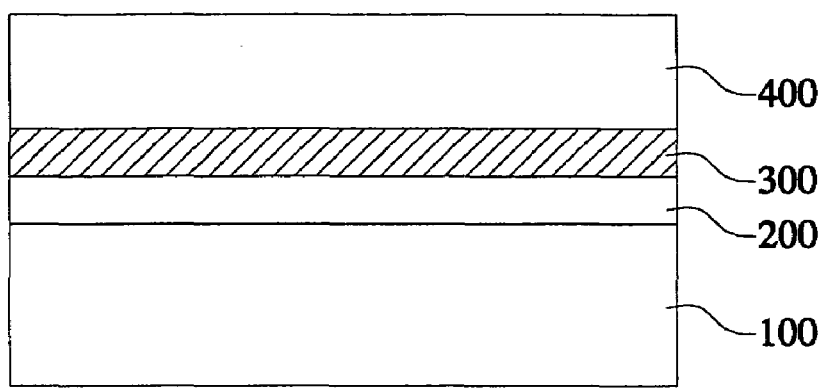
FIGS. 2A to 2G are cross-sectional diagrams illustrating an example method of forming a self-aligned contact structure in accordance with an embodiment of the present invention.

FIGS. 2A to 2G are cross-sectional diagrams illustrating a method of forming a self-aligned contact structure in accordance with an embodiment of the present invention. Referring to FIG. 2A, a lower insulating layer 200 is formed on a semiconductor substrate 100. The semiconductor substrate 100 may have active regions (not shown) or conductive pads (not shown) therein for electrical connections to be formed thereto. When the active regions are exposed on the surface of the semiconductor substrate 100, the lower insulating layer 200 may serve as a gate dielectric layer.

The lower insulating layer 200 may be formed of an oxide layer or a nitride layer, for example. When the lower insulating layer 200 serves as a gate dielectric layer, it is preferable that the lower insulating layer 200 is formed of a high-k material.

If conductive pads (not shown) are exposed on the surface of the semiconductor substrate 100, the lower insulating layer 200 may be patterned to have openings exposing portions of the conductive pads.

A lower conductive layer 300 and a mask layer 400 are sequentially formed on the entire surface of the semiconductor substrate 100 having the lower insulating layer 200. The lower conductive layer 300 may be formed of a single conductive layer or a number of conductive layers stacked in sequence. Preferably, the lower conductive layer 300 may be formed by sequentially stacking a polysilicon layer and a metal silicide layer or by sequentially stacking a diffusion barrier layer and a metal layer. The metal layer may be a tungsten layer, for example.

The mask layer 400 is formed of a material having a low etching rate for an etchant of the lower conductive layer 300 because the mask layer 400 is used as an etching mask while the lower conductive layer 300 is patterned. Preferably, the mask layer 400 may be formed of a silicon nitride layer. Also, the mask layer 400 may be formed by stacking a number of layers described later in detail as described with reference to FIGS. 3A to 3F.

Figure 2B:
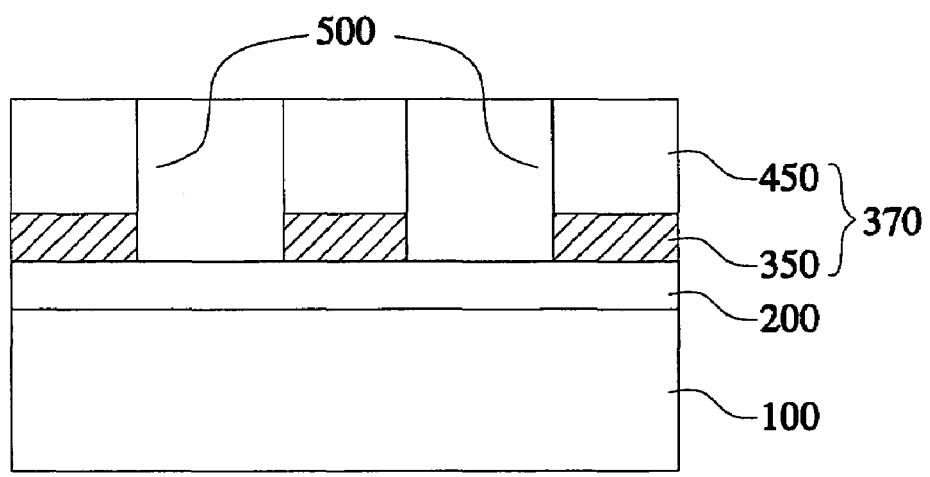

Referring to FIG. 2B, the mask layer 400 of FIG. 2A is patterned using a photolithography process and an etching process to form mask patterns 450. After the formation of the mask patterns 450, the lower conductive layer 300 of FIG. 2A is patterned using an etching process to form interconnections 350. At this time, the mask patterns 450 may be used as etching masks. As a result, interconnection patterns 370 that include the interconnections 350 and the mask patterns 450 are formed. The interconnections 350 may serve as word lines or bit lines.

An interlayer insulating layer is formed on the entire surface of the semiconductor substrate having the interconnection patterns 370 to fill gap regions between the interconnection patterns 370. It is preferable that the interlayer insulating layer is formed of a low-k dielectric layer having a low etching rate for an etchant of the mask layer 400. Preferably, the interlayer insulating layer may be formed of a silicon oxide layer. Next, the interlayer insulating layer is planarized until upper surfaces of the mask patterns 450 are exposed. As a result, interlayer insulating layer patterns 500 filling the gap regions between the interconnection patterns 370 are formed, and the upper surfaces of the mask patterns 450 are exposed, as illustrated in FIG. 2B.

In the conventional technique, the interlayer insulating layer is formed after spacers covering sidewalls of the interconnection patterns 370 are formed. Because the conventional spacers are formed of a high-k dielectric layer such as a silicon nitride layer, high coupling capacitances between the interconnections are caused in the conventional technique. On the other hand, in accordance with embodiments of the present invention, the interlayer insulating layer patterns 500 are formed without forming spacers covering the sidewalls of the interconnection patterns 370. Accordingly, coupling capacitances between interconnections can be reduced in embodiments of the present invention.

Figure 2C:
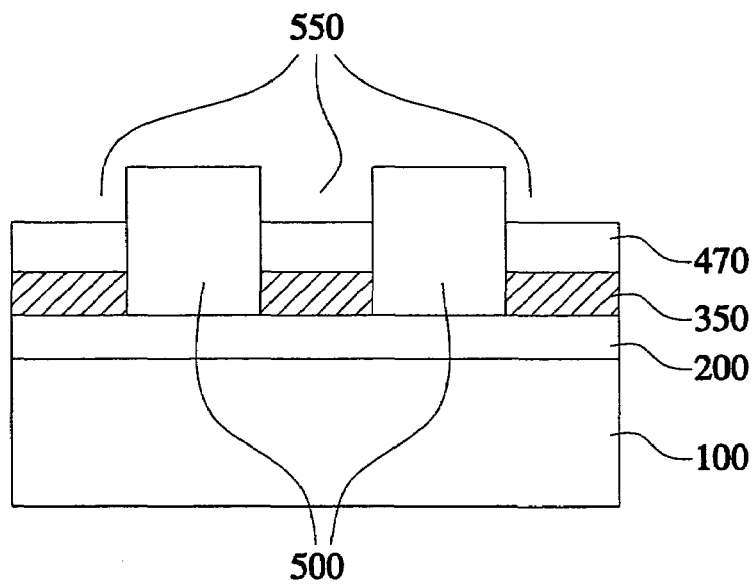

Referring to FIG. 2C, upper portions of the exposed mask patterns 450 are selectively etched to form recessed mask patterns. The mask patterns 450 may be selectively etched using a wet etching or a dry etching technique with an etchant having an etching selectivity with respect to the interlayer insulating layer patterns 500. As a result, grooves 550 defined by the interlayer insulating layer patterns 500 are formed on the surface of the mask patterns 470.

Figure 2D:
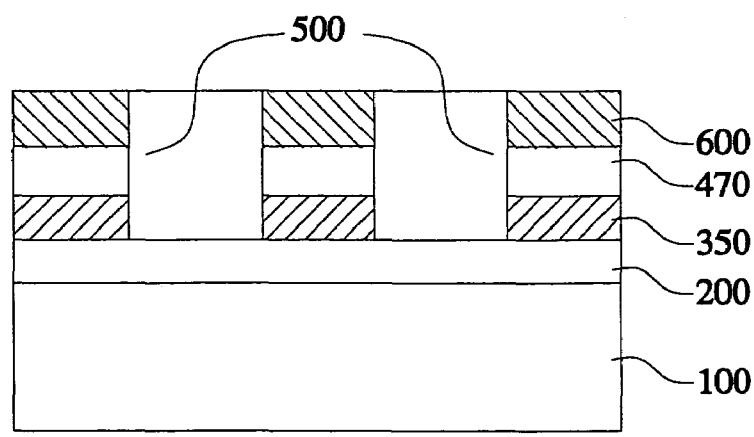

Referring to FIG. 2D, a sacrificial mask layer is formed on the entire surface of the semiconductor substrate having the grooves 550. The sacrificial mask layer is formed of a material layer having a lower etching rate than the mask layer 400 for an etching recipe for etching the interlayer insulating layer 500. Preferably, the sacrificial mask layer may be formed of a polysilicon layer.

Next, the sacrificial mask layer is planarized until surfaces of the interlayer insulating layer patterns 500 are exposed. As a result, sacrificial mask patterns 600 filling the grooves 550 and separated from each other by the interlayer insulating layer patterns 500 are formed.

Figure 2E:
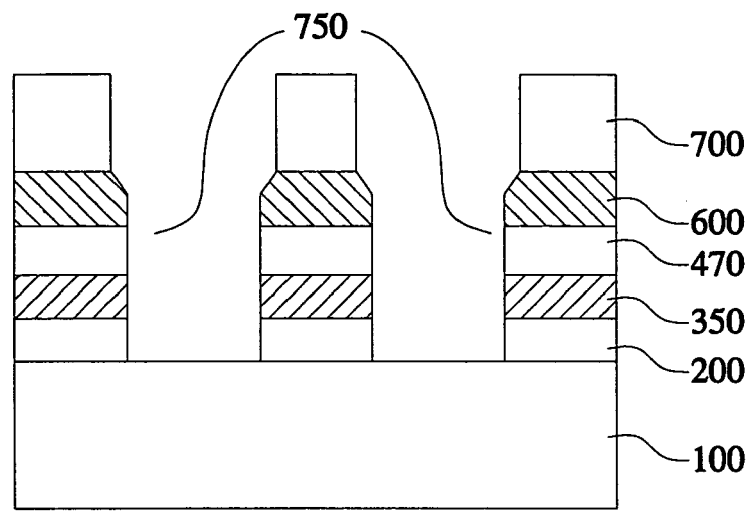

Referring to FIG. 2E, a photoresist pattern 700 having openings exposing predetermined regions of the interlayer insulating layer patterns 500 is formed on the semiconductor substrate having the sacrificial mask patterns 600. The photoresist pattern 700 is formed to have the openings overlying the active regions (not shown) or the conductive pads (not shown) formed in the semiconductor substrate.

Further, the sacrificial mask patterns 600 can be partially exposed through the openings of the photoresist pattern 700.

The openings of the photoresist pattern 700 may be formed in a hole-shape or a line-shape crossing over the sacrificial mask patterns 600.

Using the photoresist pattern 700 and the sacrificial mask pattern 600 as etching masks, the interlayer insulating layer patterns 500 and the lower insulating layer 200 are sequentially etched. As a result, self-aligned contact holes 750 are formed to expose the active regions (not shown) or the pads (not shown) in the semiconductor substrate 100.

At this time, top corners of the sacrificial mask patterns 600 may be etched away. However, since an etching rate of the sacrificial mask patterns 600 is lower than that of a silicon nitride layer, the self-aligned contact holes 750 can be formed by using the mask patterns thinner than the conventional mask patterns without exposing surfaces of the interconnections 350.

Figure 2F:
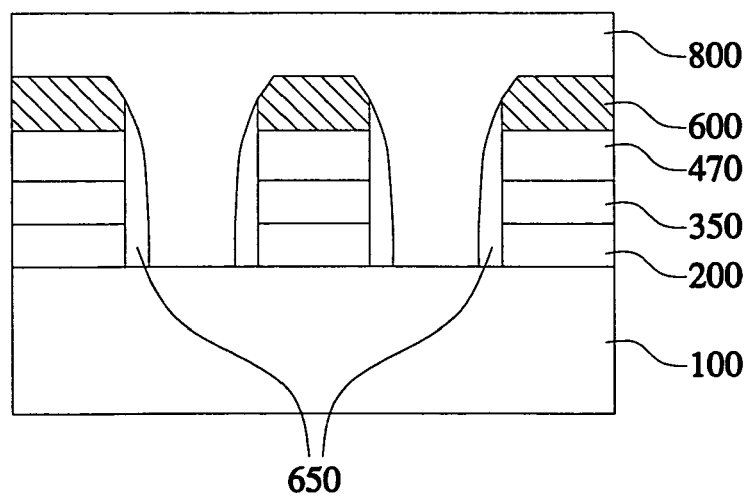

Referring to FIG. 2F, after the contact holes 750 are formed, the photoresist pattern 700 is removed. Next, a spacer insulating layer is formed on the entire surface of the semiconductor substrate having the contact holes 750. The spacer insulating layer may be formed of a silicon oxide layer or a silicon nitride layer. Since the silicon oxide layer has a lower dielectric constant than the silicon nitride layer, it has an advantage of reducing coupling capacitances more than the silicon nitride layer.

The spacer insulating layer is etched back to form spacers 650 covering the sidewalls of the contact holes 750. Next, an upper conductive layer 800 is formed on the entire surface of the semiconductor substrate having the spacers 650 to fill the contact holes 750. The upper conductive layer 800 may be formed of a polysilicon layer or a metal layer, for example. When the upper conductive layer 800 is formed of a metal layer, a diffusion barrier layer is preferably formed before the formation of the metal layer.

Figure 2G:
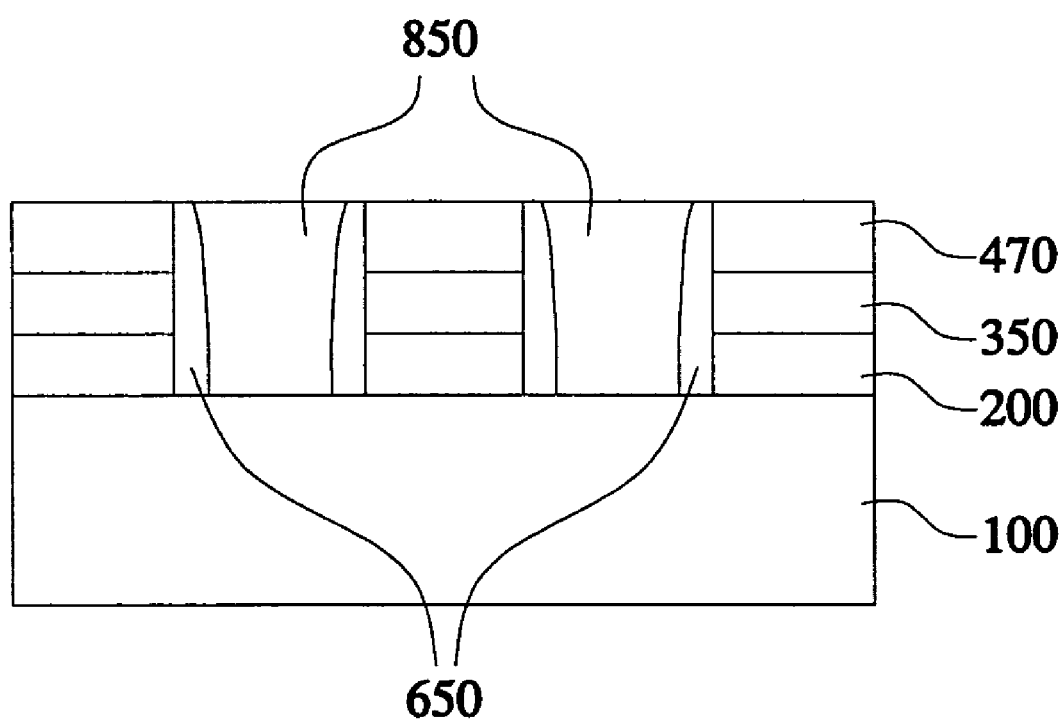

Referring to FIG. 2G, the upper conductive layer 800 and the sacrificial mask patterns 600 are planarized until the surfaces of the recessed mask patterns 470 are exposed. As a result, conductive plugs 850 are formed to be electrically connected to the active regions or the pads exposed at the surface of the semiconductor substrate 100. The plugs 850 are separated from each other by the recessed mask patterns 470 and the interlayer insulating layer patterns 500. The plugs 850 are able to serve as contact pads, and thus an aspect ratio of contact holes to be formed on the plugs 850 may be decreased.

In accordance with an embodiment of the present invention, since the sacrificial mask patterns 600 are completely removed, the total height of the plugs 850 decreases. Further, the interconnections 350 are hardly exposed through the contact holes 750 and breakdown voltages between the interconnections 350 and the plugs 850 increase, because of using the sacrificial mask patterns 600 having a lower etching rate than a silicon nitride layer in the etching process to form the contact holes 750. Since the interlayer insulating layer is formed to cover the interconnection patterns 370 without spacers with high dielectric constant, coupling capacitances between the interconnections 350 are reduced. Further, in the case that spacers 650 covering the sidewalls of the contact holes 750 are formed of a silicon oxide layer, coupling capacitances between the interconnections 350 and the plugs 850 are reduced.

FIG. 3A to FIG. 3F are cross-sectional diagrams useful for explaining a method of forming a self-aligned contact structure in accordance with alternative embodiments of the present invention.

Figure 3A:
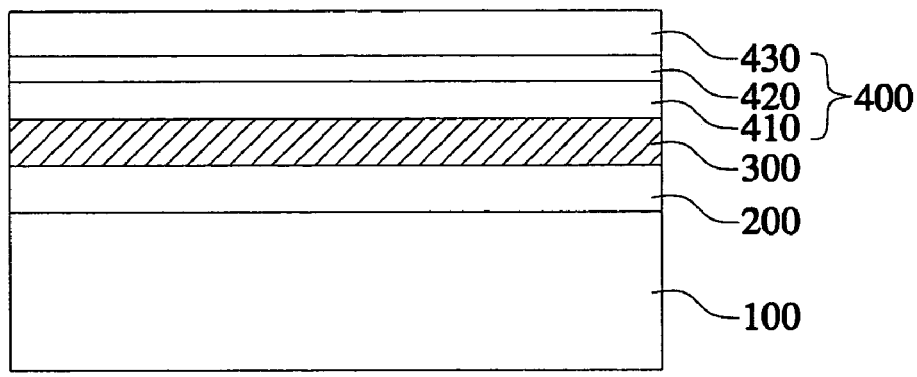
FIGS. 3A to 3F are cross-sectional diagrams illustrating an example method of forming a self-aligned contact structure in accordance with another embodiment of the present invention.

Referring to FIG. 3A, a lower insulating layer 200, a lower conductive layer 300 and a mask layer 400 are sequentially formed on a semiconductor substrate 100, as described above referring to FIG. 2A. But, the mask layer 400 is formed by stacking a first mask layer 410, a buffer layer 420 and a second mask layer 430 sequentially. Since the second mask layer 430 is used as an etching mask during an etching process of the lower conductive layer 300, it should be formed of an insulating layer with a low etching rate for an etchant of the lower conductive layer 300. Preferably, the second mask layer 430 may be formed of a silicon nitride layer.

The first mask layer 410 is used to protect the lower conductive layer 300 from etch damage, so that it may be formed of a silicon nitride layer. The buffer layer 420 serves as an etching stop layer when the second mask layer 420 is wet etched. Accordingly, the buffer layer 420 may be formed of an insulating layer with high etching selectivity with respect to the second mask layer 430. That is, when the second mask layer 430 is formed of a silicon nitride layer, the buffer layer 420 may be formed of a silicon oxide layer.

Figure 3B:
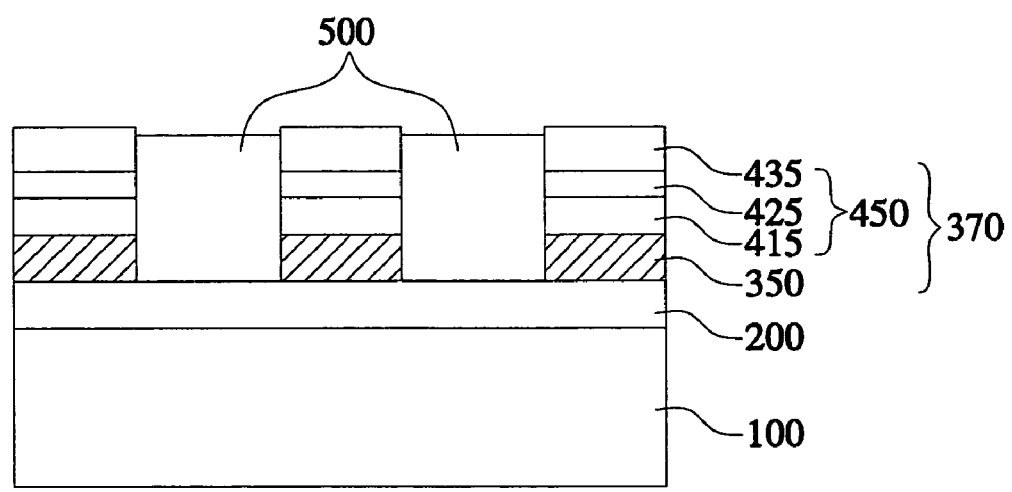

Referring to FIG. 3B, as described referring to FIG. 2B, the mask layer 400 and the lower conductive layer 300 are sequentially patterned to form mask patterns 450 and interconnections 350. As a result, interconnection patterns 370, which includes the interconnections 350 and the mask patterns 450 stacked on the interconnections 350, are formed.

The mask patterns 450 are formed by sequentially patterning the second mask layer 430, the buffer layer 420 and the first mask layer 410 using a photolithography process and an etching process. Accordingly, the mask patterns 450 include first mask patterns 415, buffer layer patterns 425 and second mask patterns 435 which are sequentially stacked.

Next, an interlayer insulating layer, as described referring to FIG. 2B, is formed on the entire surface of the semiconductor substrate having the interconnection patterns 370, and it is planarized until the surface of the mask patterns 450 is exposed. As a result, interlayer insulating layer patterns 500 filling gap regions defined by the interconnection patterns 370 are formed and the surfaces of the second mask patterns 435 are exposed.

Figure 3C:
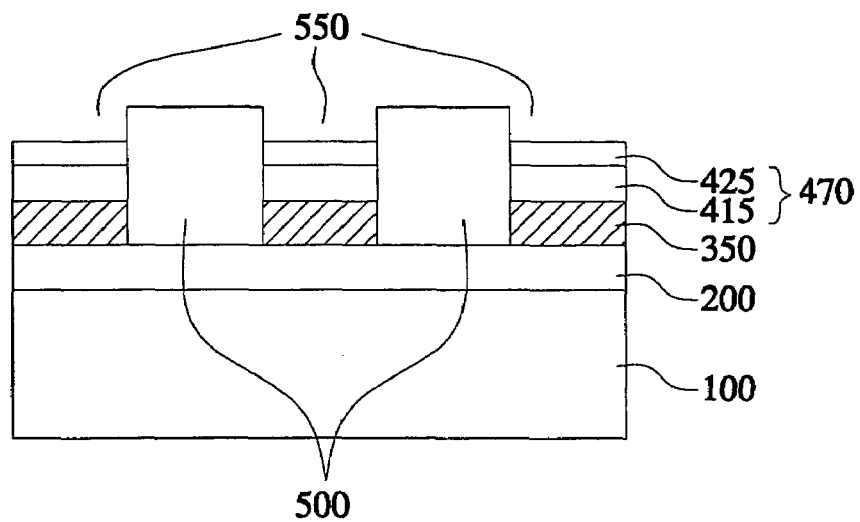

Referring to FIG. 3C, the exposed second mask patterns 435 are wet etched and removed selectively. As a result, surfaces of the buffer layer patterns 425 are exposed and recessed mask patterns 470 are formed. That is, grooves 550 defined by the interlayer insulating layer patterns 500 are formed on the buffer layer patterns 425. The buffer layer patterns 425 serve as etching stop layers when the second mask patterns 435 are wet etched. Accordingly, with the buffer layer patterns 425, the wet etching process of the second mask patterns 435 can be easily controlled.

Figure 3D:
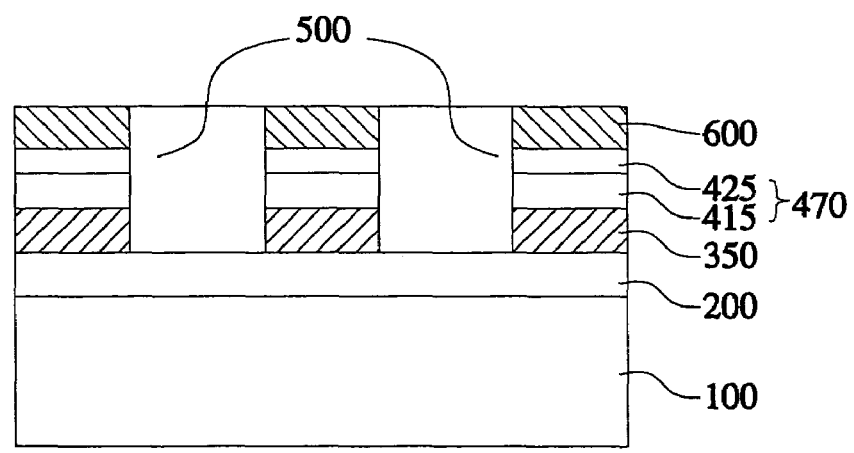

Referring to FIG. 3D, a sacrificial mask layer is formed on the entire surface of the semiconductor substrate having the grooves 550, as described referring to FIG. 2D. The sacrificial mask layer is planarized until the surfaces of the interlayer insulating layer patterns 500 are exposed to form sacrificial mask patterns 600. The sacrificial mask patterns 600 fill the grooves 550 and are separated by the interlayer insulating layer patterns 500.

Figure 3E:
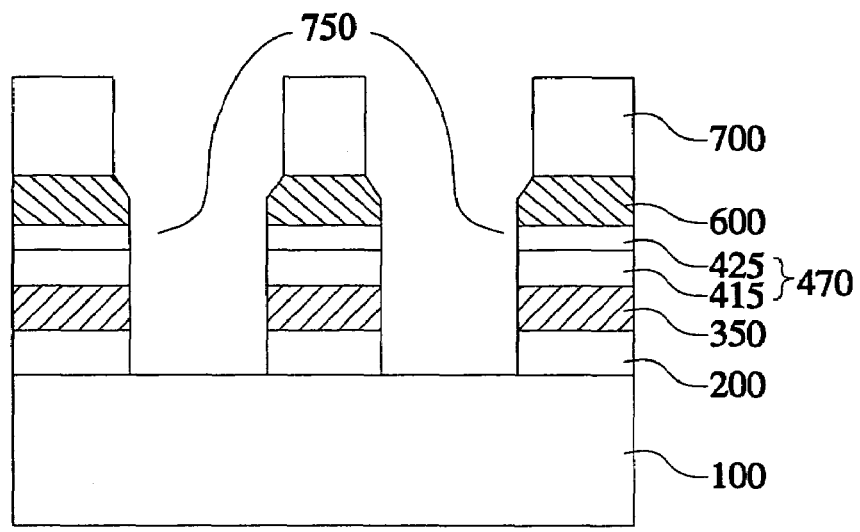

Referring to FIG. 3E, a photoresist pattern 700 having openings exposing predetermined regions of the interlayer insulating layer patterns 500 is formed, as described referring to FIG. 2E. Also, as described referring to FIG. 2E, the interlayer insulating layer patterns 500 and the lower insulating layer 200 are sequentially etched using the photoresist pattern 700 and the sacrificial mask patterns 600 as etching masks to form self-aligned contact holes 750 exposing predetermined regions of the semiconductor substrate 100.

Figure 3F:
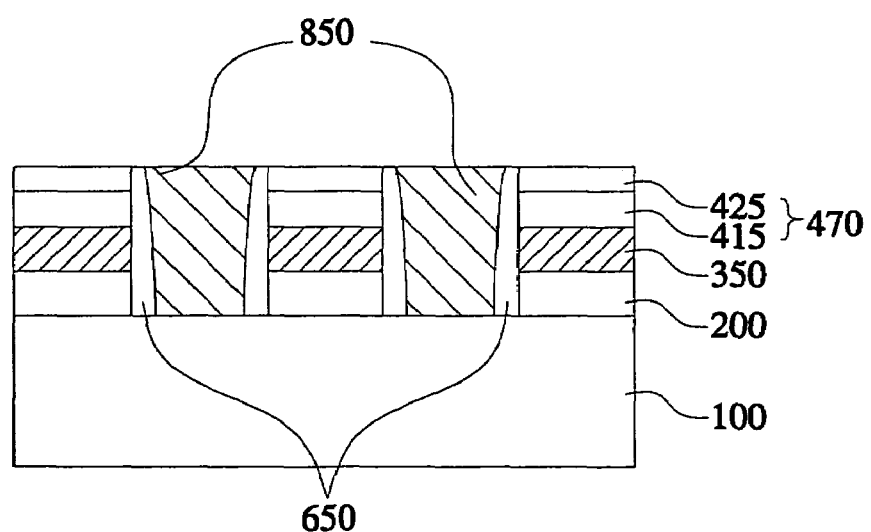

Referring to FIG. 3F, as described referring to FIGS. 2F and 2G, spacers 650 are formed on sidewalls of the self-aligned contact holes 750 and an upper conductive layer is formed on the entire surface of the semiconductor substrate having the spacers 650 to fill the self-aligned contact holes 750. Next, the upper conductive layer is planarized until the buffer layer patterns 425 are exposed to form plugs 850 in the self-aligned contact holes 750. At this time, the buffer layer patterns 425 may be removed during the planarization process.

Embodiments of the present invention described above referring to FIGS. 3A to 3F are advantageous in that the etching process is easily controlled in the step of forming the recessed mask patterns 470 since the buffer layer patterns 425 serve as an etching stop layer.

FIGS. 4A to 4F are cross-sectional diagrams useful for explaining a method of forming a self-aligned contact structure in accordance with other embodiments of the present invention.

Figure 4A:
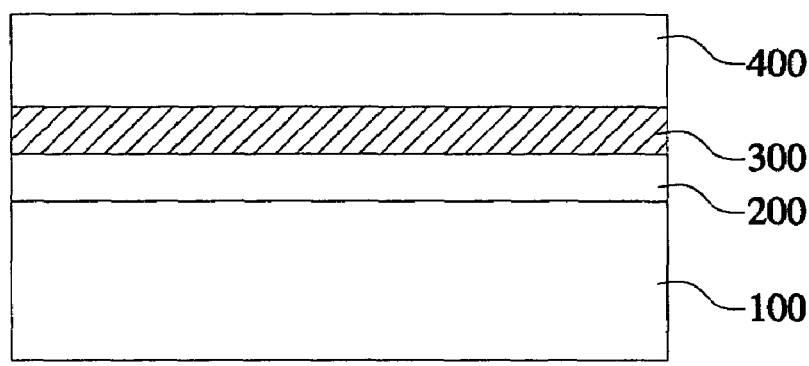
FIGS. 4A to 4H are cross-sectional diagrams illustrating an example method of forming a self-aligned contact structure in accordance with another embodiment of the present invention.
Figure 4B:
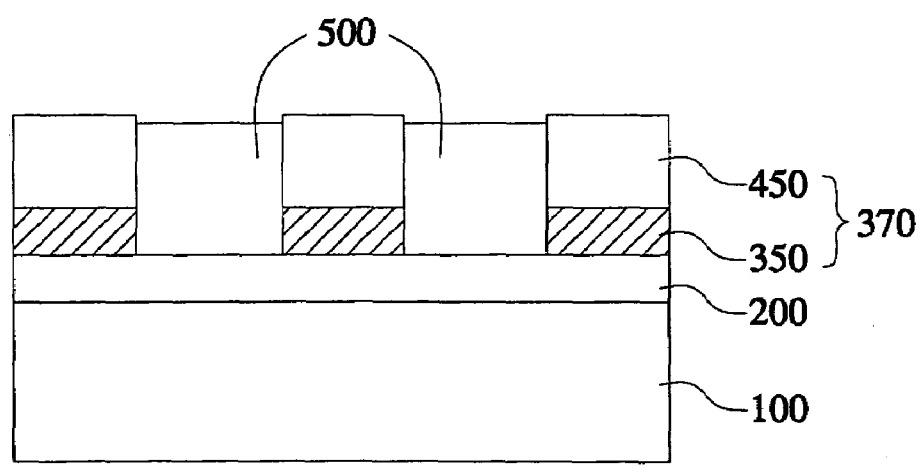
Figure 4C:
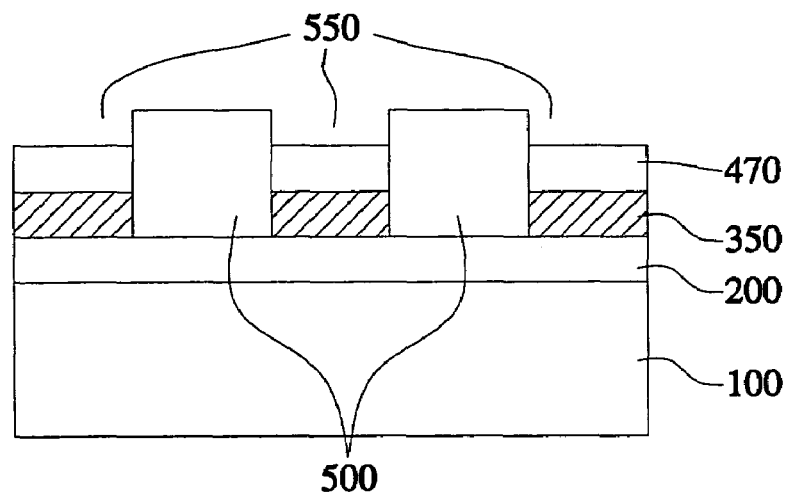

Referring to FIGS. 4A to 4C, as described referring to FIGS. 2A to 2C, a lower insulating layer 200 is formed on a semiconductor substrate 100, and interconnections 350, interlayer insulating layer patterns 500 and recessed mask patterns 470 and grooves 550 are formed.

Figure 4D:
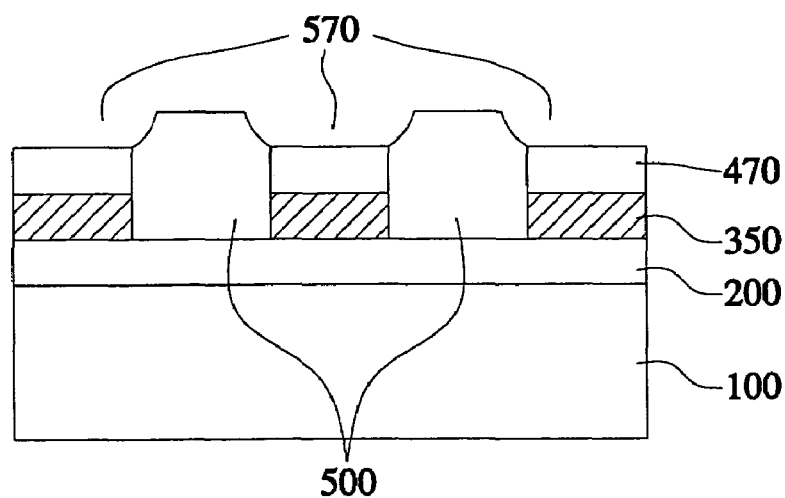

Referring to FIG. 4D, the interlayer insulating layer patterns 500 are isotropically etched to form enlarged grooves 570 on the recessed mask patterns 470. In this example the recessed mask patterns 470 has a low etching rate for an etchant of the interlayer insulating layer patterns 500, so that the recessed mask patterns 470 are partially etched.

Figure 4E:
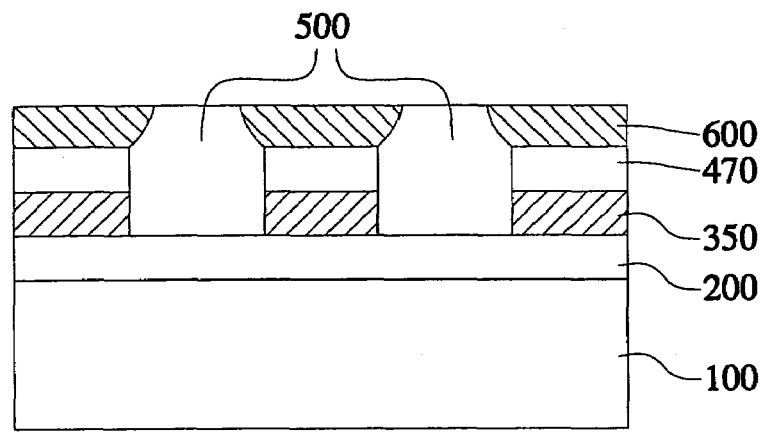

Referring to FIG. 4E, a sacrificial mask layer is formed on the entire surface of the semiconductor substrate having the enlarged grooves 570. The sacrificial mask layer, as described above referring to FIG. 2D, is formed of a material layer having a lower etching rate than the mask layer 400 in FIG. 2A for an etching recipe for etching the interlayer insulating layer patterns 500. Preferably, the sacrificial mask layer may be formed of a polysilicon layer.

The sacrificial mask layer is then planarized until the upper surfaces of the interlayer insulating layer patterns 500 are exposed to form sacrificial mask patterns 600. The sacrificial mask patterns 600 fill the enlarged grooves 570 and are separated by the interlayer insulating layer patterns 500.

Figure 4F:
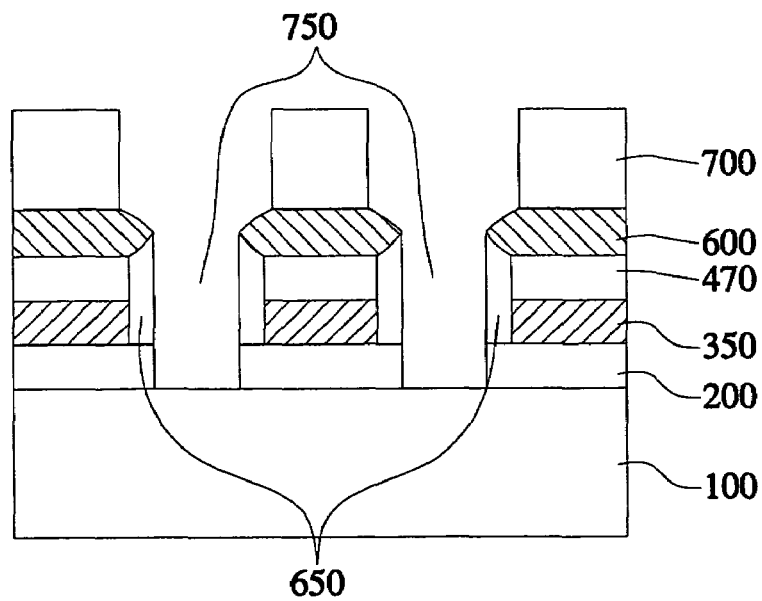

Referring to FIG. 4F, as described referring to FIG. 2E, a photoresist pattern 700 having openings exposing predetermined regions of the interlayer insulating layer patterns 500 is formed on the semiconductor substrate having the sacrificial mask patterns 600. The photoresist pattern 700 has the openings overlying the active regions (not shown) or and/or the conductive pads (not shown) in the semiconductor substrate 100 are formed. Further, the sacrificial mask patterns 600 can be partially exposed through the openings of the photoresist pattern 700.

The openings of the photoresist pattern 700 may be formed in a hole-shape or a line-shape crossing over the sacrificial mask patterns 600.

By using the photoresist pattern 700 and the sacrificial mask pattern 600 as etching masks, the interlayer insulating layer patterns 500 and the lower insulating layer 200 are etched. As a result, self-aligned contact holes 750 are formed to expose the active regions (not shown) or the pads (not shown).

At this time, the interlayer insulating layer patterns 500 partially remain between the contact holes 750 and the sidewalls of the interconnection patterns 350, 470, so that spacers 650 are formed. The spacers 650 are automatically formed during the formation of the self-aligned contact holes 750, thus any additional spacer formation process is not needed.

Figure 4G:
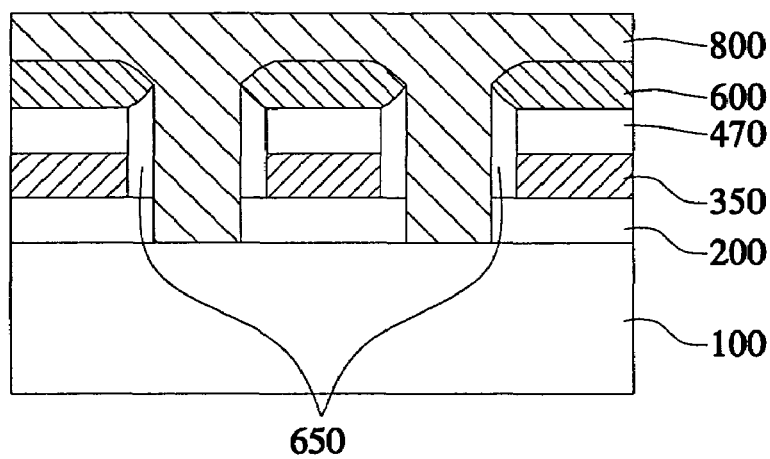

Referring to FIG. 4G, after the formation of the self-aligned contact holes 750, the photoresist pattern 700 is removed. A conductive layer 800 is then formed on the entire surface of the semiconductor substrate having the contact holes 750. As described above referring to FIG. 2F, the upper conductive layer 800 may be formed of a polysilicon layer or a metal layer, for example. A diffusion barrier layer may be formed before the metal layer is formed.

Figure 4H:
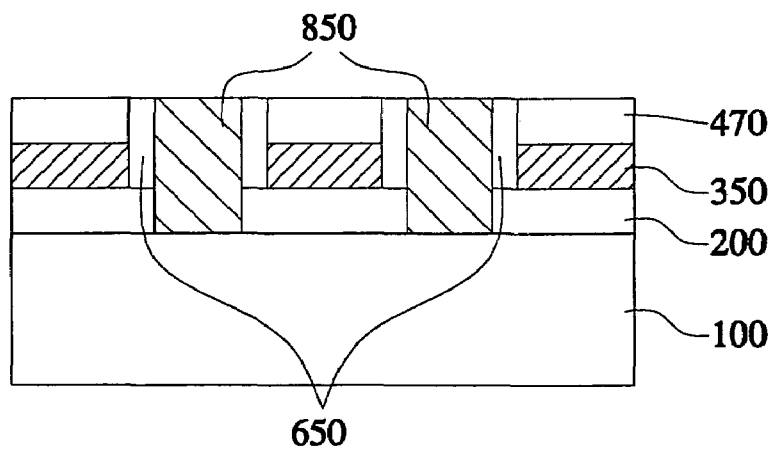

Referring to FIG. 4H, the upper conductive layer 800 and the sacrificial mask patterns 600 are planarized until the upper surfaces of the recessed mask patterns 470 are exposed. As a result, plugs 850 electrically connected to the active regions (not shown) or the conductive pads (not shown) formed in the semiconductor substrate 100 are formed. The plugs 850 are separated from each other by the recessed mask patterns 470 and the interlayer insulating layer patterns 500.

In accordance with another embodiment of the present invention with reference to FIG. 4A to FIG. 4H, the sacrificial mask patterns 600 are wider than the interconnections 350 and the recessed mask patterns 470, so that spacers 650 are formed between the sidewalls of the interconnection patterns 350 and 470 and the contact holes 750 without any additional spacer formation process when the contact holes 750 are formed. Accordingly, the process for forming the contact structure becomes simplified. Further, since the interlayer insulating layer patterns 500 has a low dielectric constant, coupling capacitances between the plugs 850 and the interconnections 350 are reduced.

FIGS. 5A to 5G are cross-sectional diagrams useful for explaining a method of forming a self-aligned contact structure in accordance with yet other embodiments of the invention, wherein the mask layer 400 is formed of a multi-layered structure.

Figure 5A:
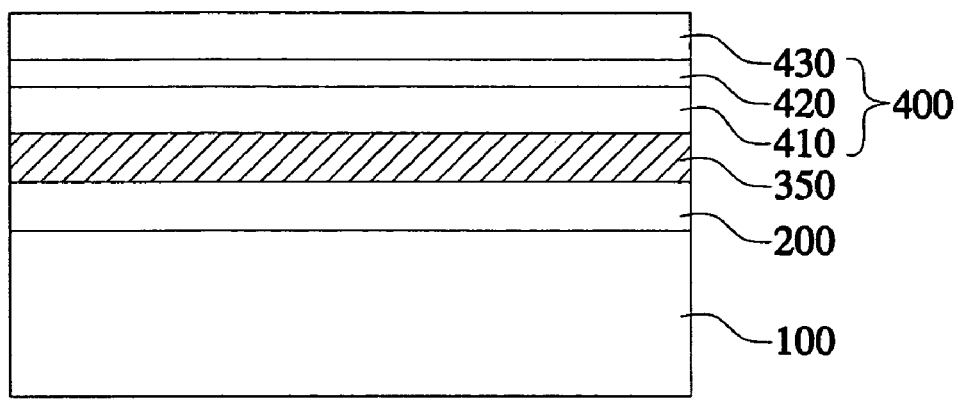
FIGS. 5A to 5G are cross-sectional diagrams illustrating an example method of forming a self-aligned contact structure in accordance with another embodiment of the present invention.
Figure 5B:
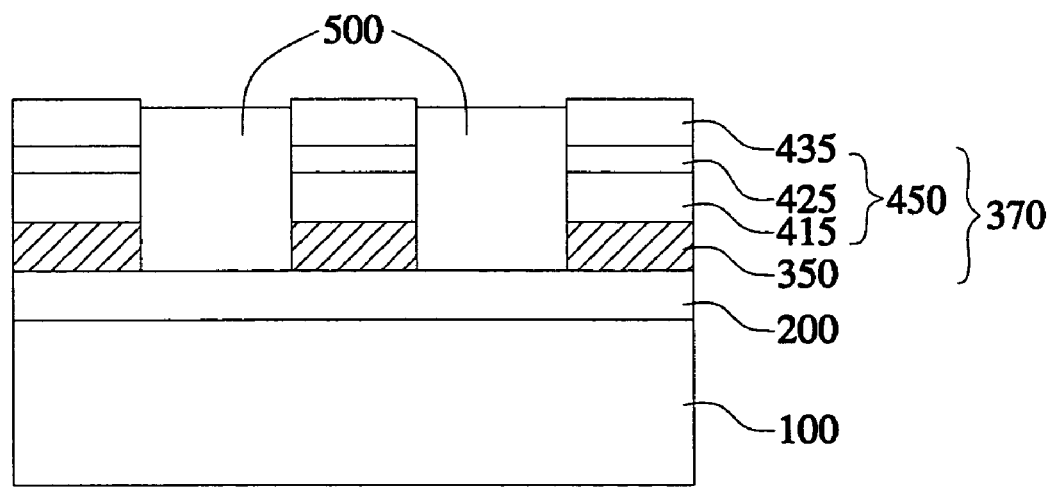
Figure 5C:
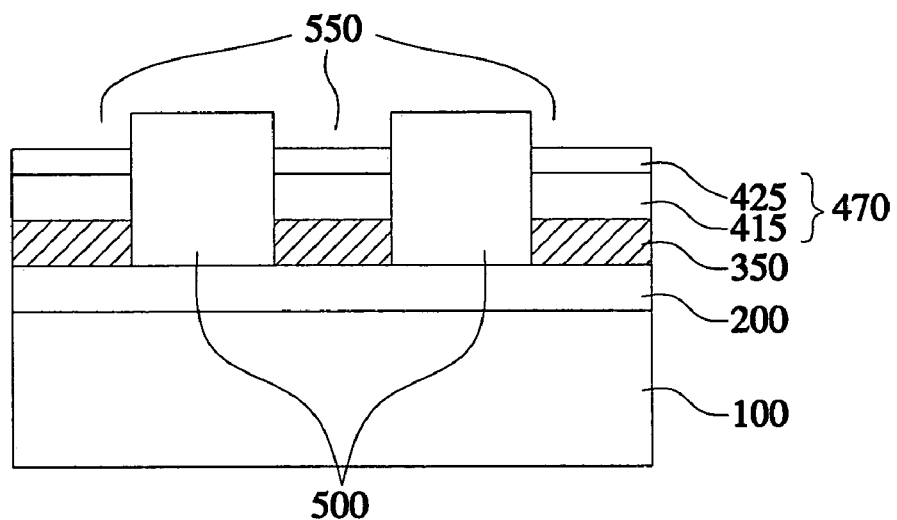

Referring to FIGS. 5A to 5C, as described above referring to FIGS. 3A to 3C, a lower insulating layer 200 is formed on a semiconductor substrate 100, and interconnection patterns 370 comprising interconnections 350, first mask patterns 415, buffer layer patterns 425, and second mask patterns 435 are formed on the lower insulating layer 200. Next, interlayer insulating layer patterns 500 are formed to fill gap regions between the interconnection patterns 370, and the second mask patterns 435 are selectively removed to form, grooves 500 as described above referring to FIGS. 3A to 3C.

Figure 5D:
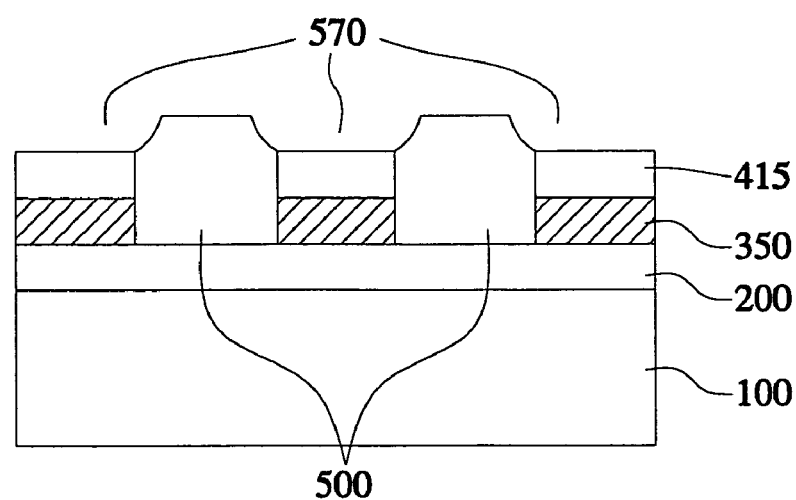

Referring to FIG. 5D, as described above referring to FIG. 4D, the interlayer insulating layer patterns 500 are isotropically etched to form enlarged grooves 570. At this time, the buffer layer patterns 425 may be etched away during the isotropic etching process. However, the first mask patterns 415 may not be removed since the first mask patterns 415 has a low etching rate for an etchant used during the isotropic etching process. Further, since the buffer layer patterns 425 are etched during the isotropic etching process, etched amounts of the interlayer insulating layer patterns 500 along sidewalls of the first mask patterns 415 are reduced.

Figure 5E:
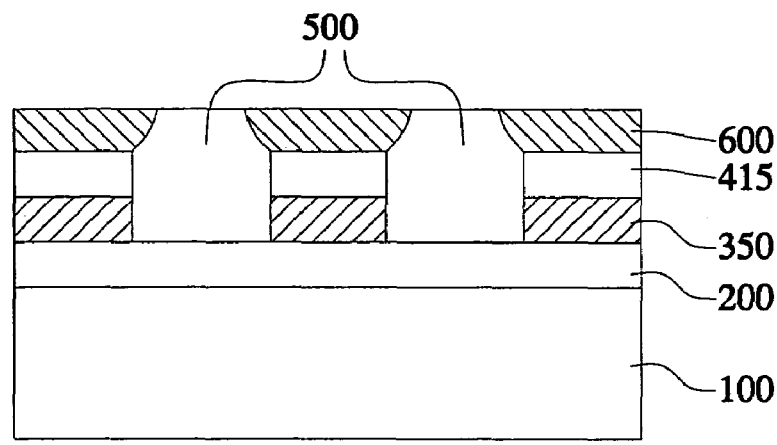

Referring to FIG. 5E, as described above referring to FIG. 4E, sacrificial mask patterns 600 are formed to be separated from each other by the interlayer insulating layer patterns 500. The first mask patterns 415 are located under the sacrificial mask patterns 600.

Figure 5F:
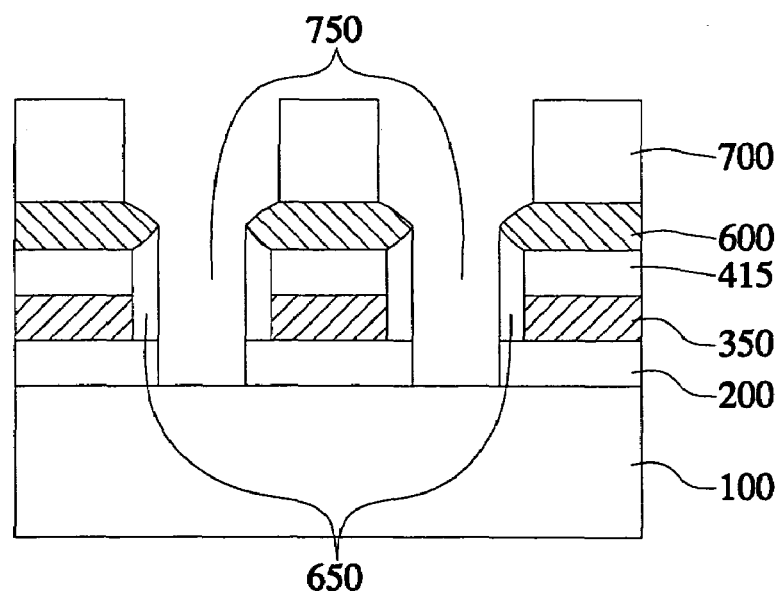

Referring to FIG. 5F, as described above referring to FIG. 4F, a photoresist pattern 700 having openings is formed on the semiconductor substrate having the sacrificial mask patterns 600, and the interlayer insulating layer patterns 500 are etched until the surface of the semiconductor substrate 100 is exposed using the photoresist pattern 700 and the sacrificial mask patterns 600 as etching masks, so that self-aligned contact holes 750 extending to the surface of the semiconductor substrate 100 are formed. At this time, spacers are automatically formed between sidewalls of the interconnection patterns 350 and 415 and the self-aligned contact holes 750 without any additional spacer formation process.

Figure 5G:
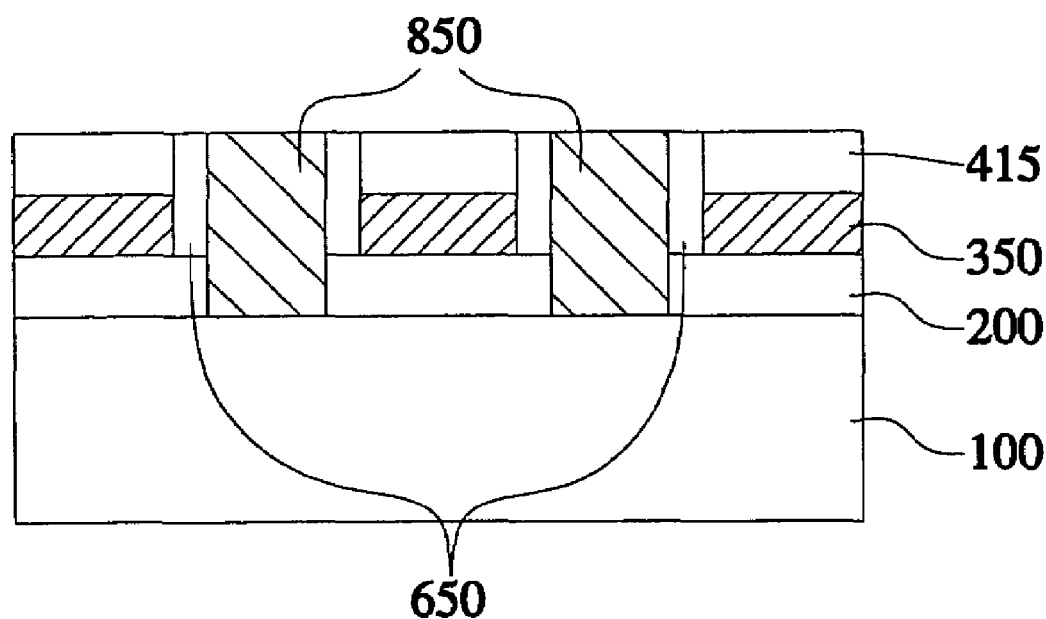

Referring to FIG. 5G, as described above referring to FIG. 4G and FIG. 4H, after the photoresist pattern 700 is removed, an upper conductive layer is formed on the entire surface of the semiconductor substrate having the contact holes 750. Next, the upper conductive layer and the sacrificial mask patterns 600 are planarized until surfaces of the first mask patterns 415 are exposed, so that plugs 850 are formed in the contact holes 750.

In accordance with other embodiments of the present invention with reference to FIGS. 5A to 5G, since the buffer layer patterns 425 serve as etching stop layers during etching the second mask patterns 435 selectively, the etching process of the second mask patterns 435 is easily controlled. Since the buffer layer patterns 425 are removed when the interlayer insulating layer patterns 500 are etched, recess amounts of the interlayer insulating layer 500 along the sidewalls of the first mask patterns 415 are minimized.

In accordance with some embodiments of the invention, there is provided a method of forming a self-aligned contact structure using a sacrificial mask layer. The method includes forming a lower conductive layer and a mask layer on a semiconductor substrate in sequence. The mask layer and the lower conductive layer are continuously patterned to form a number of parallel interconnection patterns. Each of the interconnection patterns has an interconnection and a mask pattern stacked in sequence. Interlayer insulating layer patterns are formed to fill gap regions between the interconnection patterns, and then the mask patterns are partially etched to form recessed mask patterns that define grooves between the interlayer insulating layer patterns. Then, sacrificial mask patterns are formed to fill the grooves, then a predetermined region of the interlayer insulating layer patterns is etched using the sacrificial mask patterns as etching masks to form a self-aligned contact hole that exposes a predetermined region of the semiconductor substrate. A spacer covering a sidewall of the self-aligned contact hole is formed and an upper conductive layer is formed on the entire surface of the semiconductor substrate having the spacer to fill the self-aligned contact hole. The upper conductive layer and the sacrificial mask patterns then are planarized until upper surfaces of the recessed mask patterns are exposed to form a plug surrounded by the spacer.

Preferably, the mask layer may be formed by sequentially stacking a first mask layer, a buffer layer and a second mask layer. In this case, the mask patterns are formed by patterning the second mask layer, the buffer layer and the first mask layer in sequence to form first mask layer patterns, buffer layer patterns and second mask layer patterns. Also, the recessed mask patterns are formed by selectively etching the second mask patterns to expose the buffer layer patterns.

In accordance with another embodiment of the invention, there is provided a method of forming a self-aligned contact structure using a sacrificial mask layer. The method includes sequentially forming a lower conductive layer and a mask layer on a semiconductor substrate. The mask layer and the lower conductive layer are continuously patterned to form a number of parallel interconnection patterns. Each of the interconnection patterns has an interconnection and a mask pattern, which are stacked in sequence. Interlayer insulating layer patterns are formed to fill gap regions between the interconnection patterns, and then the mask patterns are partially etched to form recessed mask patterns that define grooves between the interlayer insulating layer patterns. Then, the interlayer insulating layer patterns between the grooves are isotropically etched to form enlarged grooves wider than the recessed mask patterns. Next, sacrificial mask patterns are formed to fill the enlarged grooves, and then a predetermined region of the interlayer insulating layer patterns are anisotropically etched using the sacrificial mask patterns as etching masks, thereby forming a self-aligned contact hole that exposes a predetermined region of the semiconductor substrate. At this time, portions of the interlayer insulating layer patterns remain between sidewalls of the interconnection patterns and the self-aligned contact hole. Next, an upper conductive layer filling the self-aligned contact hole is formed on the entire surface of the semiconductor substrate having the self-aligned contact hole. The upper conductive layer and the sacrificial mask patterns are then planarized until the upper surfaces of the recessed mask patterns are exposed, thereby forming a plug that fills the self-aligned contact hole.

Preferably, the mask layer is formed by sequentially stacking a first mask layer, a buffer layer and a second mask layer. In this case, the mask patterns are formed by patterning the second mask layer, the buffer layer and the first mask layer in sequence to form first mask layer patterns, buffer layer patterns and second mask layer patterns. Also, the recessed mask patterns are formed by selectively etching the second mask patterns to expose the buffer layer patterns.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of forming a self-aligned contact structure, comprising:

forming a plurality of parallel interconnection patterns on a semiconductor substrate, wherein each of the interconnection patterns has an interconnection and a mask pattern stacked in sequence;

forming interlayer insulating layer patterns that fill gap regions between the interconnection patterns;

partially etching the mask patterns to form recessed mask patterns that define grooves between the interlayer insulating layer patterns;

forming sacrificial mask patterns that fill the grooves;

etching a predetermined region of one of the interlayer insulating layer patterns using the sacrificial mask patterns as etching masks to form a self-aligned contact hole that exposes a predetermined region of the semiconductor substrate;

forming a spacer that covers a sidewall of the self-aligned contact hole;

forming an upper conductive layer that fills the self-aligned contact hole on the entire surface of the semiconductor substrate having the spacer; and planarizing the upper conductive layer and the sacrificial mask patterns until upper surfaces of the recessed mask patterns are exposed to form a plug surrounded by the spacer.

2. The method of claim 1, wherein forming the interconnection patterns comprises:

sequentially forming a lower conductive layer and a mask layer on the semiconductor substrate; and patterning the mask layer and the lower conductive layer.

3. The method of claim 2, wherein the lower conductive layer is formed by stacking a polysilicon layer and a metal silicide layer in sequence, or by stacking a diffusion barrier layer and a metal layer in sequence.

4. The method of claim 2, wherein the mask layer is formed of an insulating layer having a low etching rate for an etchant of the lower conductive layer.

5. The method of claim 4, wherein the insulating layer having a low etching rate is a silicon nitride layer.

6. The method of claim 1, wherein the interlayer insulating layer patterns are formed of a low-k dielectric layer having a low dielectric constant with respect to a silicon nitride layer and a low etching rate for an etchant of the mask patterns.

7. The method of claim 6, wherein the low-k dielectric layer is a silicon oxide layer.

8. The method of claim 1, wherein the sacrificial mask patterns are formed of a material layer having a lower etching rate than the mask patterns for an etching recipe for etching the interlayer insulating layer patterns.

9. The method of claim 8, wherein the material layer having a lower etching rate than the mask patterns is a polysilicon layer.

10. The method of claim 1, wherein the spacer is formed of the same material layer with the interlayer insulating layer patterns.

11. The method of claim 1, wherein the upper conductive layer is a polysilicon layer.

12. A method of forming a self-aligned contact structure, comprising:

forming a plurality of parallel interconnection patterns on a semiconductor substrate, wherein each of the interconnection patterns has an interconnection, a first mask pattern, a buffer layer pattern and a second mask pattern which are stacked in sequence;

forming an interlayer insulating layer patterns that fill gap regions between the interconnection patterns;

etching the second mask patterns to form grooves that expose the buffer layer patterns between the interlayer insulating layer patterns;

forming sacrificial mask patterns that fill the grooves;

etching a predetermined region of the interlayer insulating layer patterns using the sacrificial mask patterns as etching masks to form a self-aligned contact hole that exposes a predetermined region of the semiconductor substrate;

forming a spacer that covers a sidewall of the self-aligned contact hole;

forming an upper conductive layer that fills the self-aligned contact hole on the entire surface of the semiconductor substrate having the spacer;

planarizing the upper conductive layer and the sacrificial mask patterns until the upper surfaces of the buffer layer patterns are exposed to form a plug surrounded by the spacer.

13. The method of claim 12, wherein forming the interconnection patterns comprises:

sequentially forming a lower conductive layer, a first mask layer, a buffer layer and a second mask layer on the semiconductor substrate; and continuously patterning the second mask layer, the buffer layer, the first mask layer and the lower conductive layer.

14. The method of claim 13, wherein the lower conductive layer is formed by stacking a polysilicon layer and a metal silicide layer in sequence, or by stacking a diffusion barrier layer and a metal layer in sequence.

15. The method of claim 13, wherein the first mask layer is a silicon nitride layer.

16. The method of claim 13, wherein the buffer layer is an insulating layer having an etching selectivity with respect to the second mask layer.

17. The method of claim 13, wherein the second mask layer is formed of an insulating layer having a low etching rate for an etchant of the lower conductive layer.

18. The method of claim 17, wherein the insulating layer having a low etching rate is a silicon nitride layer.

19. The method of claim 12, wherein the interlayer insulating layer patterns are formed of a low-k dielectric layer having a low dielectric constant with respect to a silicon nitride layer and a low etching rate for an etchant of the mask patterns.

20. The method of claim 19, wherein the low-k dielectric layer is a silicon oxide layer.

21. The method of claim 12, wherein the sacrificial mask patterns are formed of a material layer having a lower etching rate than the second mask patterns for an etching recipe for etching the interlayer insulating layer patterns.

22. The method of claim 21, wherein the material layer having a lower etching rate than the second mask patterns is a polysilicon layer.

23. The method of claim 12, wherein the spacer is formed of the same material layer with the interlayer insulating layer patterns.

24. The method of claim 12, wherein the upper conductive layer is a polysilicon layer.

25. The method of claim 12, further comprising planarizing the buffer layer patterns until the upper surfaces of the first mask patterns are exposed after planarizing the upper conductive layer and the sacrificial mask patterns.

26. A method of forming a self-aligned contact structure, comprising:

forming a plurality of parallel interconnection patterns on a semiconductor substrate, wherein each of the interconnection patterns has a interconnection and a mask pattern stacked in sequence;

forming an interlayer insulating layer patterns that fill gap regions between the interconnection patterns;

partially etching the mask patterns to form recessed mask patterns that define grooves between the interlayer insulating layer patterns;

isotropically etching the interlayer insulating layer patterns between the grooves to form enlarged grooves that are wider than the recessed mask patterns;

forming sacrificial mask patterns that fill the enlarged grooves;

anisotropically etching a predetermined region of one of the interlayer insulating layer patterns using the sacrificial mask patterns as etching masks to form a self-aligned contact hole that exposes a predetermined region of the semiconductor substrate, wherein portions of the interlayer insulating layer patterns remain between sidewalls of the interconnection patterns and the self-aligned contact hole;

forming an upper conductive layer that fills the self-aligned contact hole on the entire surface of the semiconductor substrate having the self-aligned contact hole; and planarizing the upper conductive layer and the sacrificial mask patterns until upper surfaces of the recessed mask patterns are exposed, thereby forming a plug that fills the self-aligned contact hole.

27. The method of claim 26, wherein forming the interconnection patterns comprises:

sequentially forming a lower conductive layer and a mask layer on the semiconductor substrate; and patterning the mask layer and the lower conductive layer.

28. The method of claim 27, wherein the lower conductive layer is formed by stacking a polysilicon layer and a metal silicide layer in sequence, or by stacking a diffusion barrier layer and a metal layer in sequence.

29. The method of claim 27, wherein the mask layer is formed of an insulating layer having a low etching rate for an etchant of the lower conductive layer.

30. The method of claim 29, wherein the insulating layer having a low etching rate is a silicon nitride layer.

31. The method of claim 26, wherein the interlayer insulating layer patterns are formed of a low-k dielectric layer having a low dielectric constant with respect to a silicon nitride layer and a low etching rate for an etchant of the mask patterns.

32. The method of claim 31, wherein the low-k dielectric layer is a silicon oxide layer.

33. The method of claim 26, wherein the sacrificial mask patterns are formed of a material layer having a lower etching rate than the mask patterns for an etching recipe for etching the interlayer insulating layer patterns.

34. The method of claim 33, wherein the material layer having a lower etching rate than the mask patterns is a polysilicon layer.

35. The method of claim 26, wherein the portions of the interlayer insulating layer patterns between the sidewalls of the interconnection patterns and the self-aligned contact hole serve as spacers.

36. The method of claim 26, wherein the upper conductive layer is formed of a polysilicon layer.

37. A method of forming a self-aligned contact structure, comprising:

forming a plurality of parallel interconnection patterns on a semiconductor substrate, wherein each of the interconnection patterns has an interconnection, a first mask pattern, a buffer layer pattern and a second mask pattern which are stacked on in sequence;

forming an interlayer insulating layer patterns that fill gap regions between the interconnection patterns;

etching the second mask patterns to form grooves that expose the buffer layer patterns between the interlayer insulating layer patterns;

isotropically etching the interlayer insulating layer patterns between the grooves to form enlarged grooves that are wider than the first mask patterns;

forming sacrificial mask patterns that fill the enlarged grooves;

anisotropically etching a predetermined region of the interlayer insulating layer patterns using the sacrificial mask patterns as etching masks to form a self-aligned contact hole that exposes a predetermined region of the semiconductor substrate, wherein portions of the interlayer insulating layer patterns remain between the interconnection patterns and the self-aligned contact hole;

forming an upper conductive layer that fills the self-aligned contact hole on the entire surface of the semiconductor substrate having the self-aligned contact hole; and planarizing the upper conductive layer and the sacrificial mask patterns until the first mask patterns are exposed to form a plug that fills the self-aligned contact hole.

38. The method of claim 37, wherein forming the interconnection patterns comprises:

sequentially forming a lower conductive layer, a first mask layer, a buffer layer and a second mask layer on the semiconductor substrate; and patterning the second mask layer, the buffer layer, the first mask layer and the lower conductive layer.

39. The method of claim 38, wherein the lower conductive layer is formed by stacking a polysilicon layer and a metal silicide layer in sequence, or by stacking a diffusion barrier layer and a metal layer in sequence.

40. The method of claim 38, wherein the first mask layer is formed of a silicon nitride layer.

41. The method of claim 38, wherein the buffer layer is formed of an insulating layer having an etching selectivity with respect to the second mask layer.

42. The method of claim 38, wherein the second mask layer is formed of an insulating layer having a low etching rate for an etchant of the lower conductive layer.

43. The method of claim 42, wherein the insulating layer having a low etching rate is a silicon nitride layer.

44. The method of claim 37, wherein the interlayer insulating layer patterns are formed of a low-k dielectric layer having a low dielectric constant with respect to a silicon nitride layer and a low etching rate for an etchant of the mask patterns.

45. The method of claim 44, wherein the low-k dielectric layer is a silicon oxide layer.

46. The method of claim 37, wherein the buffer layer patterns are etched away during the formation of the enlarged grooves.

47. The method according to claim 37, wherein the sacrificial mask patterns are formed of a material layer having a lower etching rate than the second mask patterns for an etching recipe for etching the interlayer insulating layer patterns.

48. The method of claim 47, wherein the material layer having a lower etching rate than the second mask patterns is a polysilicon layer.

49. The method of claim 37, wherein the portion of the interlayer insulating layer patterns between the sidewalls of the interconnection patterns and the self-aligned contact hole serve as spacers.

50. The method of claim 37, wherein the upper conductive layer is formed of a polysilicon layer.

* * * * *